United States Patent
Tsukiyama et al.

(10) Patent No.: US 11,938,660 B2
(45) Date of Patent: Mar. 26, 2024

(54) MOLD DIE, RESIN MOLDING APPARATUS, AND METHOD FOR PRODUCING RESIN MOLDED PRODUCT

(71) Applicant: TOWA CORPORATION, Kyoto (JP)

(72) Inventors: Makoto Tsukiyama, Kyoto (JP); Atsushi Morikami, Kyoto (JP); Kosuke Araki, Kyoto (JP)

(73) Assignee: TOWA CORPORATION, Kyoto (JP)

( * ) Notice: Subject to any disclaimer, the term of this patent is extended or adjusted under 35 U.S.C. 154(b) by 44 days.

(21) Appl. No.: 17/761,448

(22) PCT Filed: May 14, 2020

(86) PCT No.: PCT/JP2020/019206
§ 371 (c)(1),
(2) Date: Mar. 17, 2022

(87) PCT Pub. No.: WO2021/053879
PCT Pub. Date: Mar. 25, 2021

(65) Prior Publication Data
US 2022/0347892 A1    Nov. 3, 2022

(30) Foreign Application Priority Data
Sep. 18, 2019    (JP) .................................. 2019-169574

(51) Int. Cl.
*B29C 45/02* (2006.01)
*B29C 33/00* (2006.01)
(Continued)

(52) U.S. Cl.
CPC .......... *B29C 45/02* (2013.01); *B29C 33/0061* (2013.01); *B29C 33/0077* (2013.01);
(Continued)

(58) Field of Classification Search
CPC ................ B29C 45/0046; B29C 45/02; B29C 45/14639; B29C 2045/14852; H01L 21/565
See application file for complete search history.

(56) References Cited

U.S. PATENT DOCUMENTS 6,200,121 B1    3/2001  Tsuruta
6,261,501 B1 *  7/2001  Miyagawa ............ H01L 21/566
                                                      264/272.17
(Continued)

FOREIGN PATENT DOCUMENTS

JP    2000-12578 A    1/2000
JP    2002-184797 A   6/2002
(Continued)

OTHER PUBLICATIONS

Machine translation of JP 2014-204082 A, Oct. 27, 2014 (Year: 2014).*
(Continued)

Primary Examiner — Benjamin A Schiffman
(74) Attorney, Agent, or Firm — Dilworth & Barrese, LLP (57) ABSTRACT

A mold die includes: a mold die body that is configured to hold an object to be molded, the object including a substrate and a chip mounted in a central area of the substrate, and that has a cavity which is rectangular in a plan view and which is configured to receive a resin material, the mold die body including: a pot for containing the resin material; a gate disposed at one side of the cavity and configured to allow the resin material to flow into the cavity; and a flow-path restricting mechanism that is disposed on both lateral sides of the cavity that are perpendicular to the one side and that is configured to narrow lateral flow paths, the lateral flow
(Continued)

paths being flow paths for the resin material flowing through the cavity in which the chip is not disposed.

5 Claims, 7 Drawing Sheets

(51) Int. Cl.
*B29C 33/20* (2006.01)
*B29C 33/38* (2006.01)
*B29C 45/00* (2006.01)
*B29C 45/03* (2006.01)
*B29C 45/14* (2006.01)
*B29C 45/26* (2006.01)
*B29C 45/56* (2006.01)
*H01L 21/56* (2006.01)
*B29C 33/02* (2006.01)

(52) U.S. Cl.
CPC ............ *B29C 33/202* (2013.01); *B29C 33/38* (2013.01); *B29C 45/0046* (2013.01); *B29C 45/03* (2013.01); *B29C 45/14* (2013.01); *B29C 45/14639* (2013.01); *B29C 45/26* (2013.01); *B29C 45/56* (2013.01); *H01L 21/56* (2013.01); *B29C 2033/023* (2013.01); *B29C 2045/0051* (2013.01); *B29C 2045/14852* (2013.01)

(56) References Cited

U.S. PATENT DOCUMENTS

| | | | |
|---|---|---|---|
| 6,315,540 B1 | 11/2001 | Tsuruta | |
| 6,656,769 B2 * | 12/2003 | Lee | H01L 21/565 |
| | | | 438/126 |
| 7,927,923 B2 * | 4/2011 | James | H01L 23/4951 |
| | | | 257/667 |
| 9,452,568 B2 * | 9/2016 | Corral | B29C 70/546 |
| 10,020,211 B2 * | 7/2018 | Yu | H01L 21/565 |
| 2002/0017738 A1 * | 2/2002 | Miyajima | B29C 45/14655 |
| | | | 264/272.17 |
| 2014/0147688 A1 | 5/2014 | Corral et al. | |
| 2017/0136669 A1 * | 5/2017 | Choi | H01L 21/565 |
| 2022/0262650 A1 * | 8/2022 | Nakatsukasa | H01L 21/568 |
| 2023/0382027 A1 * | 11/2023 | Tsukiyama | B29C 45/76 |

FOREIGN PATENT DOCUMENTS

| | | | | |
|---|---|---|---|---|
| JP | 2006-156796 A | | 6/2006 | |
| JP | 2012-166430 A | | 9/2012 | |
| JP | 2012-192532 A | | 10/2012 | |
| JP | 2014-204082 A | | 10/2014 | |
| JP | 2019-181872 A | | 10/2019 | |
| JP | 6678973 B1 | | 4/2020 | |
| JP | 2021030515 A | * | 3/2021 | ......... B29C 45/0046 |
| WO | 2015/159743 A1 | | 10/2015 | |
| WO | WO-2022097392 A1 | * | 5/2022 | |

OTHER PUBLICATIONS

Office Action from counterpart Taiwanese application, dated Mar. 2, 2021.
Office Action from counterpart Japanese application, dated Jul. 9, 2020.

* cited by examiner

MOLD DIE, RESIN MOLDING APPARATUS, AND METHOD FOR PRODUCING RESIN MOLDED PRODUCT

TECHNICAL FIELD

This disclosure relates to a mold die, a resin molding apparatus, and a method for producing a resin molded product.

BACKGROUND ART

Lead frames and substrates with chips mounted thereon, for example, are typically sealed up in resin for use as electronic parts. A known resin molding apparatus for sealing up, for example, substrates in resin includes a transfer mold die for sealing up substrates such as BGA (ball grid array) substrates in resin to produce semiconductor packages (see, for example, Patent Literatures 1 and 2).

Patent Literature 1 discloses a mold die including an upper die and a lower die. The upper die has cavities, whereas the lower die has depressions in which to place substrates. The lower die is also provided with a pot in which to receive resin tablets. The upper die includes a cull block having a runner and gates through both of which molten resin flows from the pot to the cavities. The die disclosed in Patent Literature 1 is configured such that chips are at respective positions at which resin is supplied through the gates in the cull block. This allows molten resin from each gate to flow on different paths.

Patent Literature 2 discloses a mold die including an upper die and a lower die. The upper die has cavities, whereas the lower die is configured to receive BGA substrates. The lower die is also provided with a pot for containing resin. The upper die includes a cull block (upper die cavity block) that allows molten resin to flow from the pot to the cavities, and has gates configured to temporarily store molten resin from the cull block. The gates are each in the form of a groove extending along the long sides of a cavity and having a length substantially equal to the long sides. The gates each allow molten resin to flow into a cavity simultaneously over an entire long side thereof.

CITATION LIST

Patent Literature

Patent Literature 1: JP2014-204082A
Patent Literature 2: JP 2000-12578A

SUMMARY

Technical Problem

The die disclosed in Patent Literature 1, which is configured to bring molten resin into contact with chips so that it flows on different paths, lets molten resin flow faster in lateral areas of a substrate, in which a chip is not disposed, than in a chip area, in which a chip is disposed. This speed difference lets the molten resin in the lateral areas go around into the chip area to contain air (including gas generated by the molten resin), likely causing voids. Similarly, the die disclosed in Patent Literature 2, which is configured to allow molten resin to flow simultaneously over an entire long side of a cavity, lets the molten resin in lateral areas of a substrate go around into a chip area to contain air (including gas generated by the molten resin), likely causing voids. These dies may, as a result, produce a resin molded product with a low accuracy in molding. In particular, for a flip-chip substrate that is a substrate having a chip via protruding electrodes on the substrate molten resin flows slowly in a narrow space between the substrate and the chip. This lets the molten resin in lateral areas go around into the narrow space, likely causing voids.

The above circumstances have led to a demand for a mold die, a resin molding apparatus, and a method for producing a resin molded product each of which has an improved accuracy in molding.

Solution to Problem

A mold die according to this disclosure characteristically includes: a mold die body that is configured to hold an object to be molded, the object including a substrate and a chip mounted in a central area of the substrate, and that has a cavity which is rectangular in a plan view and which is configured to receive a resin material, the mold die body including: a pot for containing the resin material; a gate disposed at one side of the cavity and configured to allow the resin material to flow into the cavity; and a flow-path restricting mechanism that is disposed on both lateral sides of the cavity that are perpendicular to the side and that is configured to narrow lateral flow paths, the lateral flow paths being flow paths for the resin material flowing through the cavity in which the chip is not disposed.

A resin molding apparatus according to this disclosure characteristically includes: the mold die; and a mold clamp mechanism configured to clamp the mold die.

A method according to this disclosure for producing a resin molded product includes: supplying the mold die with the object to be molded and the resin material; clamping the mold die while heating the resin material; and causing the resin material to flow through the gate into the cavity for resin molding of the object to be molded while causing the flow-path restricting mechanism to narrow the lateral flow paths.

Advantageous Effects

This disclosure provides a mold die, a resin molding apparatus, and a method for producing a resin molded product each of which has an improved accuracy in molding.

DESCRIPTION OF EMBODIMENTS

The description below deals with a mold die, a resin molding apparatus, and a method for producing a resin molded product as embodiments of this disclosure with reference to drawings. This disclosure is, however, not limited to the embodiments below, and may be altered variously as long as such alteration falls within the scope of this disclosure.

[Apparatus Configuration]

Objects to be molded such as lead frames and substrates with semiconductor chips (hereinafter also referred to simply as "chips") mounted thereon are sealed up in resin for use as electronic parts. Such electronic parts are used as, for example, high-frequency module substrates for portable communication terminals, module substrates for electric power control, and substrates for device control. Objects to be molded can be sealed up in resin by a transfer method, that is, a technique of sealing up, for example, BGA (ball grid array) substrates in resin to produce semiconductor packages. The transfer method includes placing, for example, substrates with chips in respective cavities of a mold die, supplying resin tablets prepared by compressing powder resin into a pot in the mold die, heating the resin tablets to melt the resin tablets into molten resin, clamping the mold die, causing the molten resin to flow into the cavities, curing the resin, and opening the mold die to produce a resin molded product.

The transfer method has required designing a mold die with air vents such that the air vents and other elements are positioned appropriately in accordance with, for example, the respective shapes of substrates and chips in order to prevent voids in a resin molded product because such voids lead to defective molding. Even with appropriate air vents, molten resin flows faster in an area of the substrate in which components such as chips, resistors, and capacitors are not disposed than in an area in which such components are disposed. This speed difference lets the molten resin in lateral areas go around into the chip area to contain air (including gas generated by the molten resin), likely causing voids. In particular, in the case of a mold underfill process for a flip-chip substrate which is a substrate having a chip via protruding electrodes on the substrate, molten resin flows slowly in a narrow space between the substrate and the chip. This lets the molten resin in lateral areas, in which the chip is not disposed, go around into the narrow space, likely causing voids. This has resulted in a resin molded product suffering from defective molding.

In view of the above, the present embodiments are a mold die C, a resin molding apparatus D, and a method for producing a resin molded product each of which has an improved accuracy in molding. The description below deals with, as an example object to be molded, a flip-chip substrate that is rectangular in a plan view. Further, the gravitational direction may be regarded as corresponding to the downward direction, whereas the direction opposite to the gravitational direction may be regarded as corresponding to the upward direction.

Figure 1:
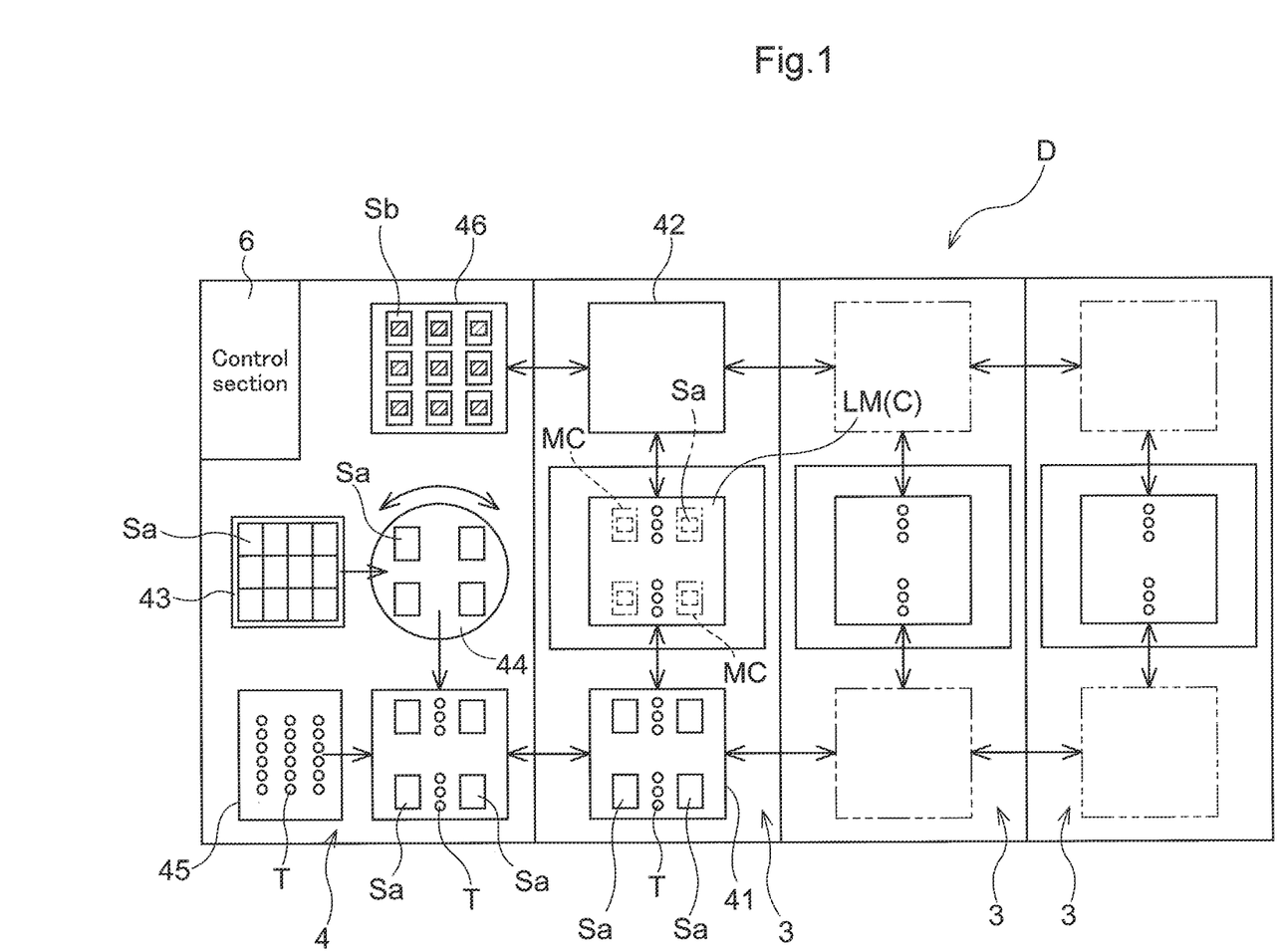
FIG. 1 is a diagram schematically illustrating a resin molding apparatus.

FIG. 1 is a diagram schematically illustrating the resin molding apparatus D. The resin molding apparatus D as the present embodiment includes molding modules 3, a supply module 4, a control section 6, and a conveying mechanism. The molding modules 3 each include a mold die C configured to seal up an object to be molded in powder resin or liquid resin. The control section 6 includes programs as software for controlling how the resin molding apparatus D is operated. The programs are stored on hardware such as a hard disc drive (HDD) or a memory, and are executed by the CPU of a computer. The control section 6, in other words, controls the respective operations of the molding modules 3, the supply module 4, and the conveying mechanism.

The powder resin may be not only resin in powder form, but also resin tablets made of solid resin prepared by compressing resin powder. Heating either form of resin results in liquid, molten resin. The powder resin may be a thermoplastic resin or a thermosetting resin. A thermosetting resin has a viscosity that decreases when heated. Continuing to heat a thermosetting resin polymerizes and cures the thermosetting resin into a cured resin. The powder resin for the present embodiment is preferably in the form of resin tablets made of solid resin in view of handleability, and is also preferably a highly flowable thermosetting resin including a particulate filler to ensure that molten resin fills the space between a chip and a substrate.

The molding modules 3 are each configured to seal up resin-sealing target substrates Sa (which is an example of the "object to be molded") in resin to produce resin-sealed substrates Sb (which is an example of the "resin molded product"). The resin molding apparatus D includes a plurality of (three for the present embodiment) molding modules 3 that are independently attachable and detachable. The molding modules 3 will be detailed later.

The supply module 4 includes a substrate supply mechanism 43, a substrate alignment mechanism 44, a resin supply mechanism 45, and a substrate container section 46. The supply module 4 also provides standby positions for a loader 41 and an unloader 42 both included in the conveying mechanism. The substrate supply mechanism 43 supplies resin-sealing target substrates Sa that it stores to the substrate alignment mechanism 44. Each resin-sealing target substrate Sa is provided with a single semiconductor chip or two or more semiconductor chips aligned lengthwise and/or widthwise. The substrate alignment mechanism 44 aligns the resin-sealing target substrates Sa, which it has received from the substrate supply mechanism 43, in a manner suitable for conveyance. The resin supply mechanism 45 stores resin tablets T (which is an example of the "resin material") in a pattern suitable for conveyance.

The conveying mechanism includes a loader 41 and an unloader 42. The loader 41 conveys, for example, resin-sealing target substrates Sa, that is, substrates that are provided with semiconductor chips mounted thereon and that have not been sealed up in resin, and resin tablets T. The unloader 42 conveys resin-sealed substrates Sb, that is, substrates that have been sealed up in resin. The loader 41 is capable of receiving a plurality of (four for the present embodiment) resin-sealing target substrates Sa from the substrate alignment mechanism 44, receiving a plurality of (six for the present embodiment) resin tablets T from the resin supply mechanism 45, moving on a rail from the supply module 4 to any of the molding modules 3, and supplying the resin-sealing target substrates Sa and the resin tablets T to the molding module 3. The unloader 42 is capable of taking resin-sealed substrates Sb from any of the molding modules 3, moving on a rail from the molding module 3 to the substrate container section 46, and storing the resin-sealed substrates Sb onto the substrate container section 46. Each resin-sealed substrate Sb is provided with a semiconductor chip(s) sealed up in cured resin resulting from hardening of molten resin.

The description below deals with the molding modules 3 in detail.

Figure 2:
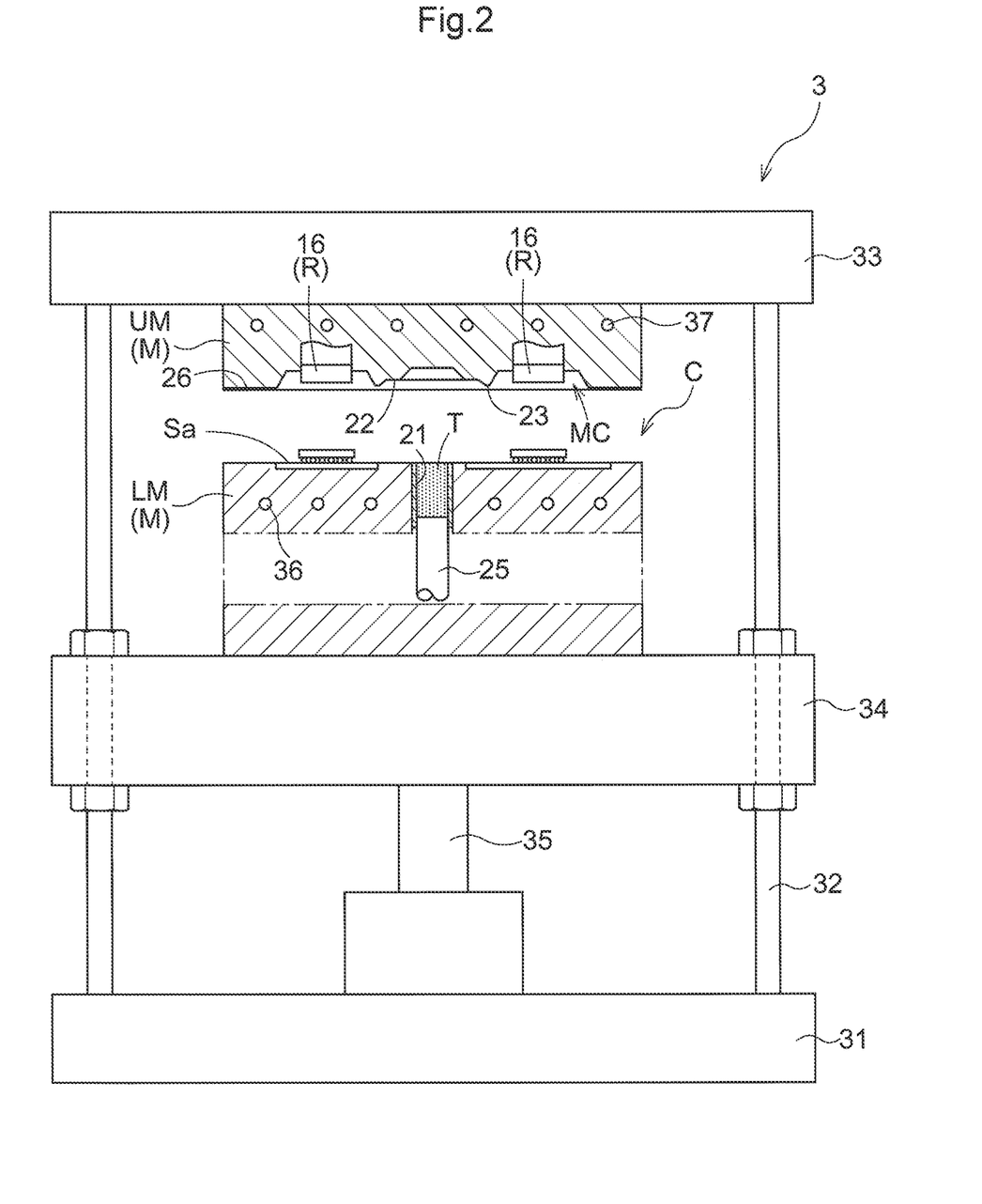
FIG. 2 is a diagram schematically illustrating a molding module.

As illustrated in FIG. 2, each molding module 3 includes a lower fixed plate 31 that is rectangular in a plan view, four tie bars 32 standing at the respective corners of the lower fixed plate 31, and an upper fixed plate 33 that is rectangular in a plan view and that is near the respective upper ends of the tie bars 32. The molding module 3 also includes, between the lower fixed plate 31 and the upper fixed plate 33, a movable platen 34 that is rectangular in a plan view. The movable platen 34 has four holes at the respective corners thereof through which the tie bars 32 extend, and is movable in the up-down direction along the tie bars 32. The molding module 3 includes, over the lower fixed plate 31, a mold clamp mechanism 35 configured to move the movable platen 34 upward and downward. The mold clamp mechanism 35 is capable of moving the movable platen 34 upward to clamp the mold die C and downward to open the mold die C. The mold clamp mechanism 35 may be driven by any driving source. The driving source may be, for example, an electric motor such as a servomotor, but is not limited thereto.

The mold die C includes a mold die body M including a lower die LM and an upper die UM that are made of, for example, metal and that face each other.

The lower die LM includes substrate placement sections each shaped to receive a resin-sealing target substrate Sa with a face upward on which components such as a semiconductor chip(s) are mounted. The lower die LM contains a lower heater 36 configured to heat resin-sealing target substrates Sa and resin tablets T. The lower die LM is provided with a cylindrical pot 21 shrink-fitted or otherwise fixed thereto that is configured to receive resin tablets T (that is, resin to be heated to melt). The lower die LM is also provided with a plunger 25 at a lower portion of the cylindrical internal space of the pot 21. The plunger 25 is drivable by an electric motor such as a servomotor (not illustrated in the drawings), and is movable upward and downward.

The upper die UM has cavities MC each of which is rectangular in a plan view and configured to receive molten resin. The upper die UM contains an upper heater 37 configured to heat the cavities MC. The upper die UM includes a cavity block having the cavities MC and a cull block having a runner 22 that allows molten resin to flow from the pot 21 to the cavities MC. The cavity block has air vents 26 configured to discharge air from the cavities MC. The cavity block and the cull block are separate, fixed members of the upper die UM. The cull block has gates 23 each serving as the entrance of a cavity MC through which molten resin flows from the runner 22 into the cavity MC. The upper die UM also includes a flow-path restricting mechanism R (described later). The cavity block and the cull block may alternatively be integral with each other. Further, the upper die UM may alternatively include an air vent block having the air vents 26 as a block separate from the cavity block.

Figure 3:
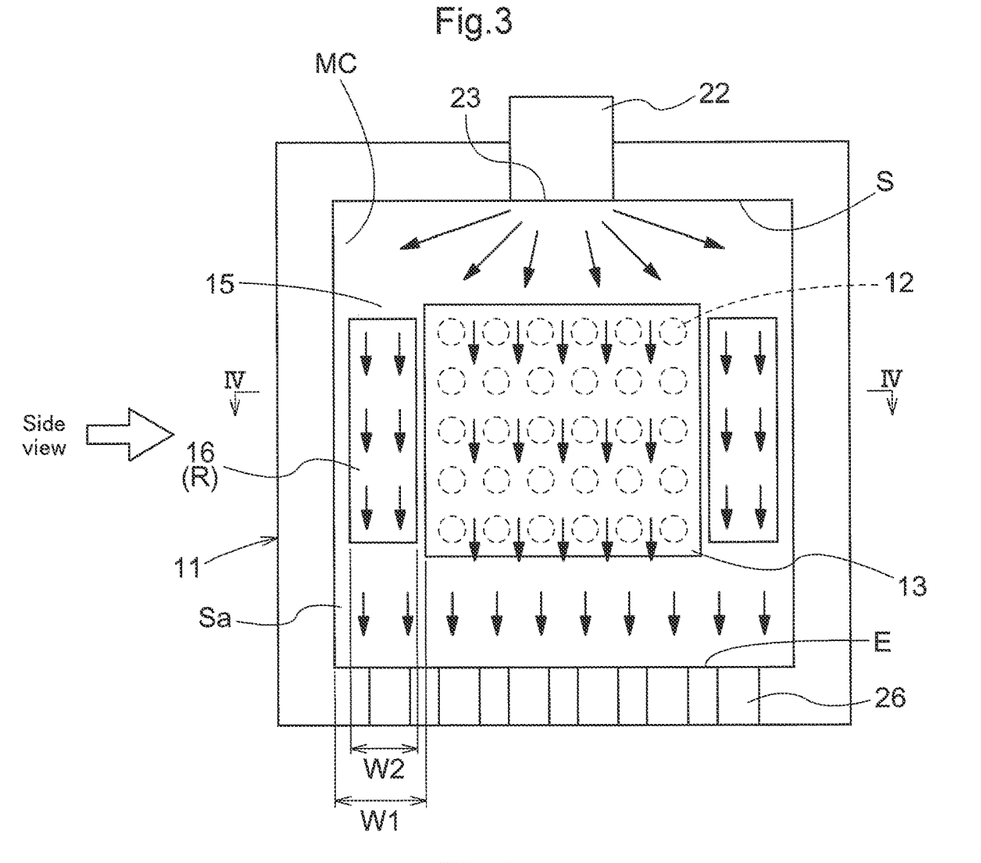
FIG. 3 is a diagram schematically illustrating a mold die body as viewed from above.
Figure 4:
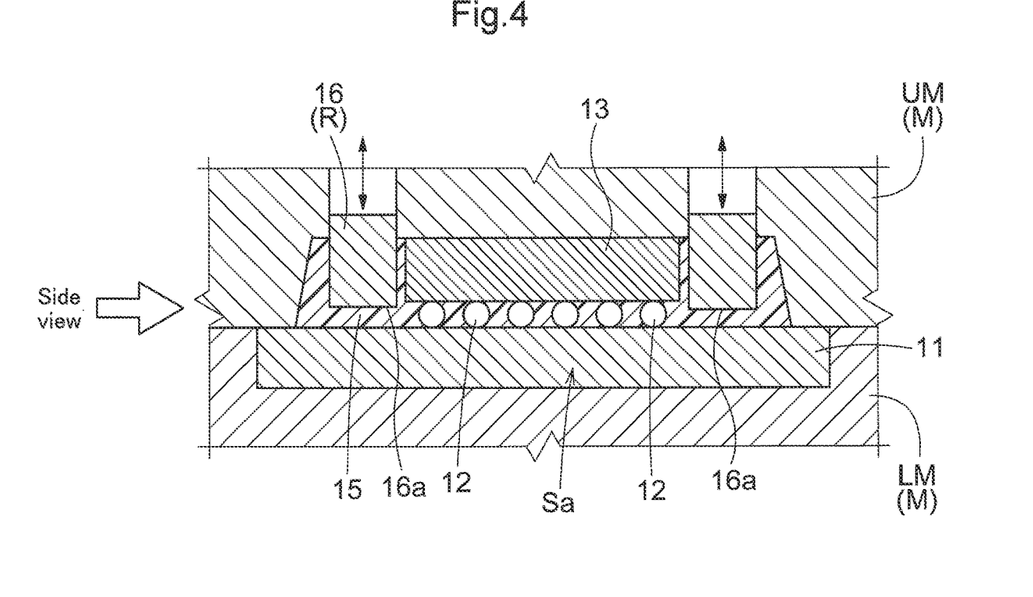
FIG. 4 is a diagram schematically illustrating a cross section of the mold die body taken along line IV-IV in FIG. 3.

The description below deals with the mold die body M with reference to FIGS. 3 and 4. FIG. 3 is a diagram schematically illustrating a cavity MC in a plan view. FIG. 4 is a diagram schematically illustrating a cross section of the cavity MC taken along line IV-IV in FIG. 3 in the direction perpendicular to FIG. 3 (that is, in the up-down direction). The present embodiment described here is arranged to expose a face of a chip 13 (see FIG. 4), but may alternatively be arranged to cover that face with resin.

As illustrated in FIG. 3, each cavity MC has, at a central portion of one side S thereof, a gate 23 through which the cavity MC receives molten resin that has flown from the above-described pot 21 into the runner 22. The cavity MC has, at another side E thereof opposite to the one side S, air vents 26 through which air may be discharged from the cavity MC. As illustrated in FIGS. 3 and 4, each resin-sealing target substrate Sa for the present embodiment is a flip-chip substrate, which includes a substrate 11, a plurality of protruding electrodes 12 arranged on the substrate 11 in a two-dimensional array, and a chip 13 electrically connected to the protruding electrodes 12. The protruding electrodes 12 and the chip 13 are in a central area of the substrate 11 in a plan view. The central area is a chip area, whereas the area of the substrate 11 surrounding the central area is a non-chip area. The chip 13 is, for example, an IC chip, which includes a semiconductor chip and a large number of electronic elements and lines on the semiconductor chip.

On such a flip-chip substrate, molten resin supplied through the gate 23 flows from the one side S of the cavity MC (that is, the starting end of the flow) to the other side E thereof (that is, the terminal end of the flow). The molten resin would flow faster in (i) lateral areas of the substrate 11 in each of which the chip 13 is not disposed (that is, the areas extending along both lateral sides of the substrate 11 from the one side S of the cavity MC to the other side E thereof) than in (ii) the chip area, in which the chip 13 is disposed (that is, the central area of the substrate 11). This speed difference would let the molten resin in the lateral areas go around into the chip area to contain air (including gas generated by the molten resin), likely causing voids. For a flip-chip substrate which is a substrate 11 having a chip 13 via protruding electrodes 12 on the substrate 11, in particular, molten resin would flow even more slowly in the narrow space between the substrate 11 and the chip 13 (that is, the area in which the protruding electrodes 12 are disposed) than in the lateral areas in which the chip 13 is not disposed. This would let the molten resin in the lateral areas go around into the narrow space, likely causing voids.

In view of the above, the mold die body M for the present embodiment includes a flow-path restricting mechanism R on both lateral sides of the cavity MC that are perpendicular to the one side S and the other side E of the cavity MC. The flow-path restricting mechanism R is configured to narrow lateral flow paths 15 for molten resin flowing through the cavity MC. Specifically, the flow-path restricting mechanism R is configured to narrow the lateral flow paths 15 (that is, reduce the cross-sectional area of each lateral flow path 15) for a predetermined time period from the start of supply of molten resin to reduce the amount of molten resin flowing through the lateral flow paths 15. The flow-path restricting mechanism R is in the form of a pair of movable blocks 16 (which is an example of the "restrictor"). The movable blocks 16 for the present embodiment are each a rectangular parallelepiped. The movable blocks 16 each have a width W2 that is approximately 90% of the width W1 of the corresponding lateral flow path 15 (that is, approximately 90% of the minimum width between the corresponding lateral side of the chip 13 and the corresponding wall face of the cavity MC). The width W2 of each movable block 16 has a proportion to the width W1 of the corresponding lateral flow path 15 which proportion is selected as appropriate in view of such matters as the viscosity of the molten resin, the size of the gap between the chip 13 and the substrate 11, and the size and number of the protruding electrodes 12. The proportion is, however, preferably approximately 50% or higher. Each movable block 16 is moved to have a leading end 16a (that is, the lower end face) at such a height that in a side view, the leading end 16a is in the narrow space between the substrate 11 and the chip 13 (that is, the gap area between the substrate 11 and the chip 13). This narrows the lateral flow paths 15. Each movable block 16 is, in other words, arranged such that while it has narrowed the corresponding lateral flow path 15, the leading end 16a coincides in a side view with the narrow space between the substrate 11 and the chip 13. The movable blocks 16 are drivable by a driving force from, for example, an air cylinder or a servomotor (not illustrated in the drawings) to be inserted into or pulled out of the cavity MC, which narrows or fully opens the lateral flow paths 15 of the cavity MC. The movable blocks 16 for the present embodiment are provided for the upper die UM in such a manner as to be movable upward and downward, and substantially entirely cover those areas of the lateral flow paths 15 of the cavity MC which are laterally adjacent to the chip 13.

The leading end 16a of each movable block 16, when positioned in the narrow space between the substrate 11 and the chip 13 in a side view, has a height from the substrate 11 which height is selected such that molten resin flows through the lateral flow paths 15 at a speed nearly equal to the speed at which molten resin flows in the narrow space between the substrate 11 and the chip 13. The movable blocks 16 are moved after the predetermined time period to stop narrowing and widen the lateral flow paths 15 to fully open. The predetermined time period is adjusted in view of such factors as the size of the gap between the chip 13 and the substrate 11, the size and number of the protruding electrodes 12, and the viscosity of the molten resin to prevent molten resin from flowing from an outer area of the cavity MC into an inner area thereof. The movable blocks 16 may, for instance, be moved to fully open the lateral flow paths 15 when molten resin has reached the terminal end of the flow (the other side E) or when molten resin has filled the entire narrow space between the substrate 11 and the chip 13. Alternatively, the flow of molten resin may be simulated for adjustment such that molten resin flows through the lateral flow paths 15 at a speed nearly equal to the speed at which molten resin flows in the narrow space between the substrate 11 and the chip 13.

As described above, the flow-path restricting mechanism R is on both lateral sides of the cavity MC that are perpendicular to the one side S and the other side E of the cavity MC, and is configured to narrow lateral flow paths 15 for molten resin flowing through the cavity MC. The flow-path restricting mechanism R reduces the amount of molten resin flowing through the lateral flow paths 15. For a resin-sealing target substrate Sa provided with, for example, a chip 13 and protruding electrodes 12, which are flow resistances for molten resin, the above configuration allows molten resin to flow in the outer area of the cavity MC, in which the chip 13 is not disposed, at a speed nearly equal to the speed at which molten resin flows in the inner area of the cavity MC, in which the chip 13 is disposed. This allows the leading portions of molten resin in the outer area of the cavity MC to be tend to be aligned horizontally with the leading portion of molten resin in the inner area of the cavity MC, and thereby prevents the molten resin in the outer area from laterally entering the inner area to contain air at the terminal end of the flow (the other side E) of molten resin through the cavity MC. This in turn likely prevents voids in resin-sealed substrates Sb (resin molded product), improving the accuracy in molding.

Further, the flow-path restricting mechanism R is in the form of movable blocks 16 each arranged such that while it has narrowed the corresponding lateral flow path 15, the leading end 16a coincides in a side view with the narrow space between the substrate 11 and the chip 13. This reliably reduces the amount of molten resin flowing through the lateral flow paths 15. This in turn allows molten resin to flow in the outer area of the cavity MC, in which the chip 13 is not disposed, at a speed nearly equal to the speed at which molten resin flows in the narrow space between the substrate 11 and the chip 13. For a flip-chip substrate as an object to be molded, the above arrangement allows the leading portions of molten resin in the outer area of the cavity MC to be lateral to the leading portion of molten resin in the inner area of the cavity MC, and thereby prevents the molten resin in the outer area from laterally entering the inner area to contain air at the terminal end of the flow (the other side E) of molten resin through the cavity MC.

[Method for Producing Resin Molded Product]

The description below deals with a method for producing a resin molded product with reference to FIGS. 1 to 4.

As illustrated in FIG. 1, the resin molding apparatus D preheats the loader 41 while thermally insulating the space for containing resin tablets T, and also supplies electric power to the heaters 36 and 37 in advance to heat the mold die body M. The loader 41 then receives a plurality of resin-sealing target substrates Sa having been taken out from the substrate supply mechanism 43. The loader 41 also receives resin tablets T as aligned by the resin supply mechanism 45 into the space for containing resin tablets T. The loader 41 conveys the resin-sealing target substrates Sa to a molding module 3. The loader 41 then places the resin-sealing target substrates Sa onto substrate placement sections of the lower die LM with each resin-sealing target substrate Sa having a face facing upward on which a semiconductor chip is mounted, and supplies the resin tablets T into the pot 21 (supplying step; see FIG. 2).

Then, as illustrated in FIG. 2, the mold clamp mechanism 35 raises the movable platen 34 to move the lower die LM relatively toward the upper die UM and thereby clamp the mold die C (clamping step). During this operation, the movable blocks 16 have been lowered to narrow the lateral flow paths 15, and air is discharged from the cavity MC through the air vents 26 (see FIG. 3). Then, the lower heater 36 in the lower die LM heats the resin tablets T in the pot 21 to melt the resin tablets T, and also heats the resin-sealing target substrates Sa fixed to the lower die LM (molding step; see FIG. 2).

Then, when the resin tablets T have been melted into molten resin, the plunger 25 is moved upward to cause the molten resin to flow from the pot 21 through the runner 22 to the gates 23 (molding step; see FIG. 2). The molten resin flows into each cavity MC through the corresponding gate 23. The heaters 36 and 37 further heat the cavities MC, thereby curing the molten resin in each cavity MC. This results in the resin-sealing target substrates Sa being sealed up in resin, producing resin-sealed substrates Sb (resin molded product) (molding step; see FIG. 2). During the molding step, molten resin having entered each cavity MC through the corresponding gate 23 flows from one side S of the cavity MC to another side E thereof, as illustrated in FIG. 3. Molten resin having reached the chip area enters the narrow space between the substrate 11 and the chip 13 in a central area of the substrate 11, and starts to flow in a reduced amount. The protruding electrodes 12 between the chip 13 and the substrate 11 also hinder the flow of the molten resin and thereby reduce the amount of the flow.

Meanwhile, the flow-path restricting mechanism R narrows the lateral flow paths 15 in the respective lateral areas of the substrate 11 for a predetermined time period to reduce the amount of molten resin flowing through the lateral flow paths 15. This allows molten resin to flow through the lateral flow paths 15 at a speed nearly equal to the speed at which molten resin flows in the narrow space between the substrate 11 and the chip 13. This in turn allows the leading portion of molten resin through the lateral flow paths 15 to be substantially aligned horizontally with the respective leading portions of molten resin in the narrow space in a direction parallel to the other side E of the cavity MC at the terminal end of the flow of molten resin through the cavity MC. This prevents the molten resin in the outer area from laterally entering the inner area to contain air at the terminal end of the flow (the other side E). This in turn likely prevents voids in resin-sealed substrates Sb, improving the accuracy in molding.

The movable blocks 16 are raised (that is, the flow-path restricting mechanism R is deactivated) to open the lateral flow paths 15 after a predetermined time period, for example, when molten resin has reached that side of the chip 13 which faces the terminal end of the flow (the other side E) of the cavity MC. This allows molten resin to start filling the opened space of the lateral flow paths 15 (that is, that space in the cavity MC which was occupied by the movable blocks 16). The opened space can also receive gas generated by molten resin flowing through the narrow space between the substrate 11 and the chip 13. This can prevent voids in the narrow space between the substrate 11 and the chip 13. The movable blocks 16 may be raised at any time point after molten resin has filled the central area of the substrate 11 substantially entirely.

Once molten resin has filled the cavity MC, the movable platen 34 is lowered to open the mold die C. Then, the resin-sealed substrates Sb are released from the cavity MC, and are stored onto the substrate container section 46 with use of the unloader 42 (storing step; see FIG. 1 as well). The storing step may be preceded by a step of removing unnecessary cured resin from the cull block with use of a degating mechanism (not illustrated in the drawings).

Alternative Embodiments

For ease of understanding, the description below uses the same terms and reference signs as in the description of the above embodiment for similar elements.

Figure 5:
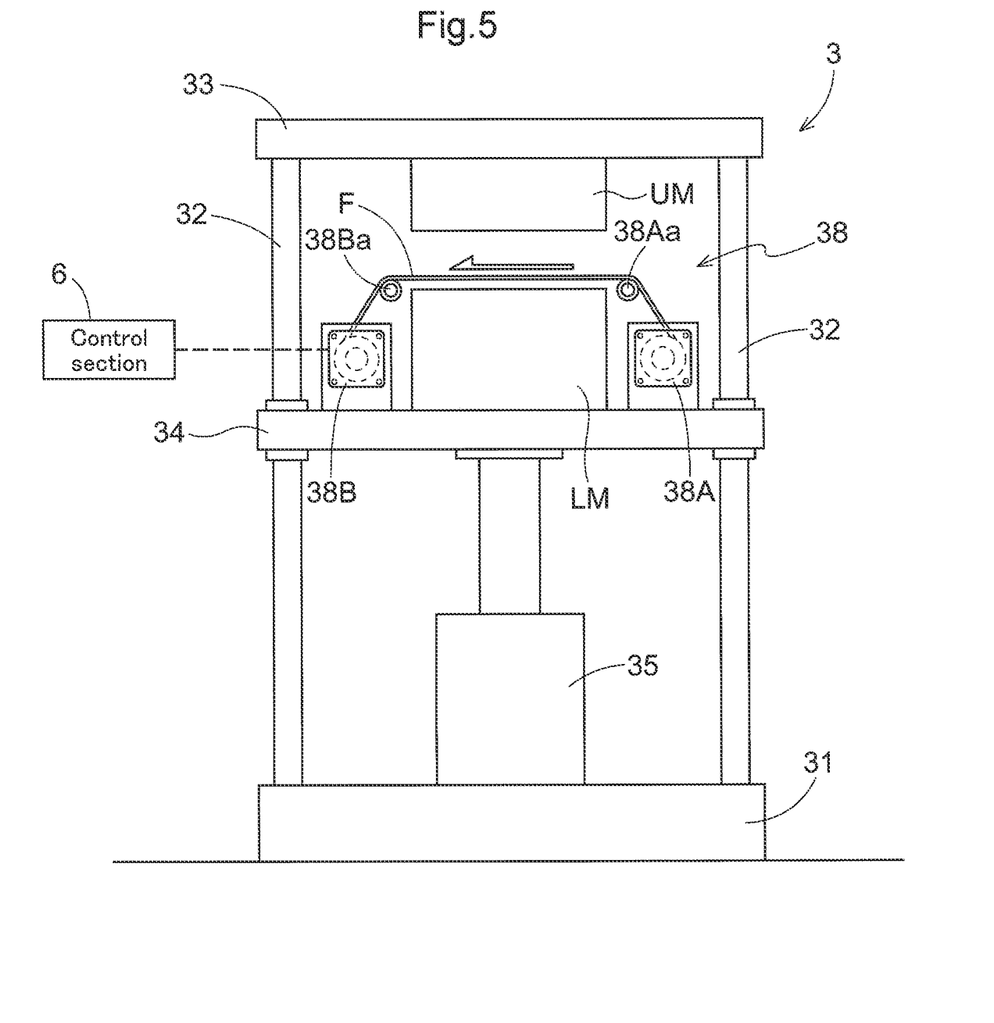
FIG. 5 is a diagram schematically illustrating a molding module for Alternative Embodiment 1.

1. As illustrated in FIG. 5, one or more of the molding modules 3 may each include a release film supply mechanism 38. The release film supply mechanism 38 includes (i) a sending mechanism 38A configured to unwind an unused release film F from a reel and supply the release film F into a space between the upper die UM and the lower die LM and (ii) a winding mechanism 38B configured to wind around a reel a release film F that has been used for resin molding. The release film supply mechanism 38 also includes a roller 38Aa between the sending mechanism 38A and the lower die LM and a roller 38Bb between the lower die LM and the winding mechanism 38B. The rollers 38Aa and 38Ba are for use to press a release film F onto the upper die UM. The sending mechanism 38A and the winding mechanism 38B each include a motor (not illustrated in the drawings) having a torque (rotation speed) controlled by the control section 6. This allows the sending mechanism 38A to supply a release film F while applying to the release film F an appropriate level of tension in the direction in which the release film F is moved.

Figure 6:
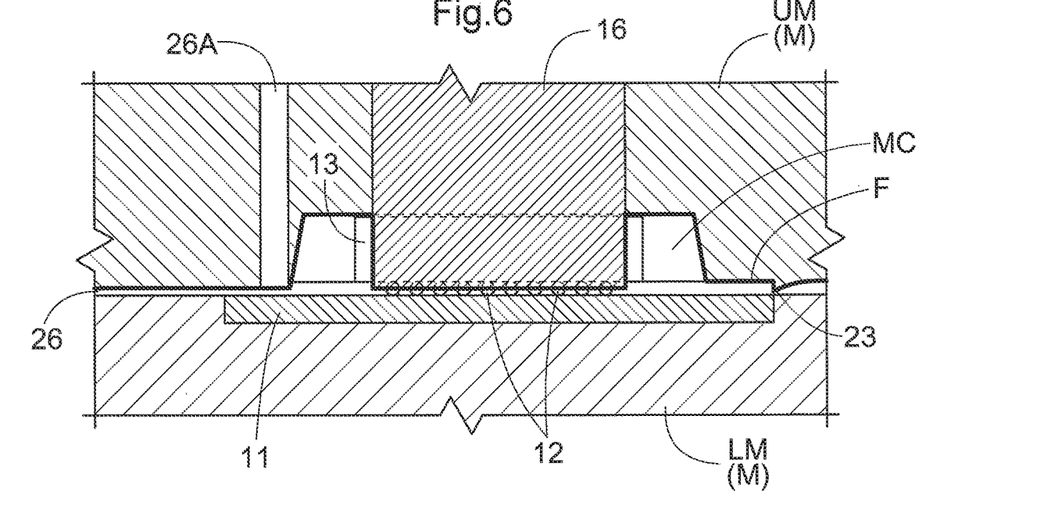
FIG. 6 is a diagram schematically illustrating a cross section of a mold die for Alternative Embodiment 1.

As illustrated in the diagram of FIG. 6 schematically illustrating a cross section of the mold die C, the mold die C for the present embodiment includes not only a cavity block having cavities MC, movable blocks 16, and air vents 26 described above, but also (i) an adsorption mechanism (not illustrated in the drawings) configured to cause a release film F to adsorb to the molding surface of the upper die UM and (ii) vent shutters 26A configured to prevent molten resin from flowing out of the cavities MC with a lower pressure. The present embodiment is configured such that the adsorption mechanism causes a release film F to adsorb to the molding surface of the upper die UM. This prevents molten resin from flowing into gaps between the movable blocks 16 and the cavity block that allow the movable blocks 16 to move relative to the upper die UM.

For the present embodiment, the method for producing a resin molded product includes lowering the vent shutters 26A to seal the cavities MC during the molding step. The vent shutters 26A are shut to seal the cavities MC at a time point that may be selected as appropriate to prevent voids in view of, for example, the size of substrates 11, the width of the narrow space, and/or the proportion of the area of the narrow space to that of each substrate 11. The time point is, for example, immediately after molten resin has filled at least the central area of the substrate 11 substantially entirely, or a predetermined time period after molten resin passed through the gates 23. This prevents molten resin flowing through the cavities MC from leaking out.

Figure 7:
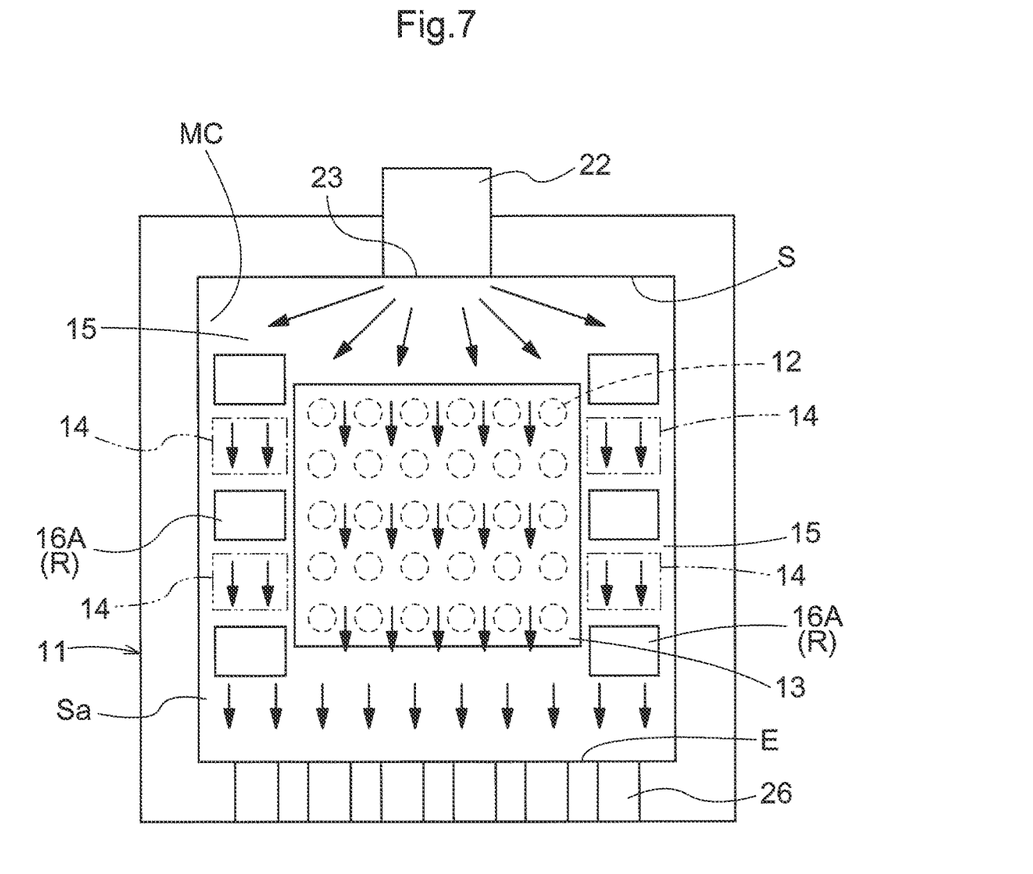
FIG. 7 is a diagram schematically illustrating a mold die for Alternative Embodiment 2 as viewed from above.

2. As illustrated in FIG. 7, the present embodiment involves, an object to be molded, a substrate 11 provided with a chip 13 in the central area and a plurality of individual passive components 14 such as capacitors, coils, and resistors in the lateral areas. The flow-path restricting mechanism R for the present embodiment is in the form of a plurality of movable blocks 16A (which is an example of the "restrictor") configured to narrow the lateral flow paths 15 and each positioned not to come into contact with the individual passive components 14. The movable blocks 16A are sized and positioned in view of the speed of the flow of molten resin through the narrow space between the substrate 11 and the chip 13 as well as, for example, the respective flow resistances and footprints of the individual passive components 14. Specifically, the movable blocks 16A are sized and positioned through a simulation of the flow of molten resin for adjustment such that molten resin flows through the lateral flow paths 15 at a speed nearly equal to the speed at which molten resin flows in the narrow space between the substrate 11 and the chip 13.

Figure 8:
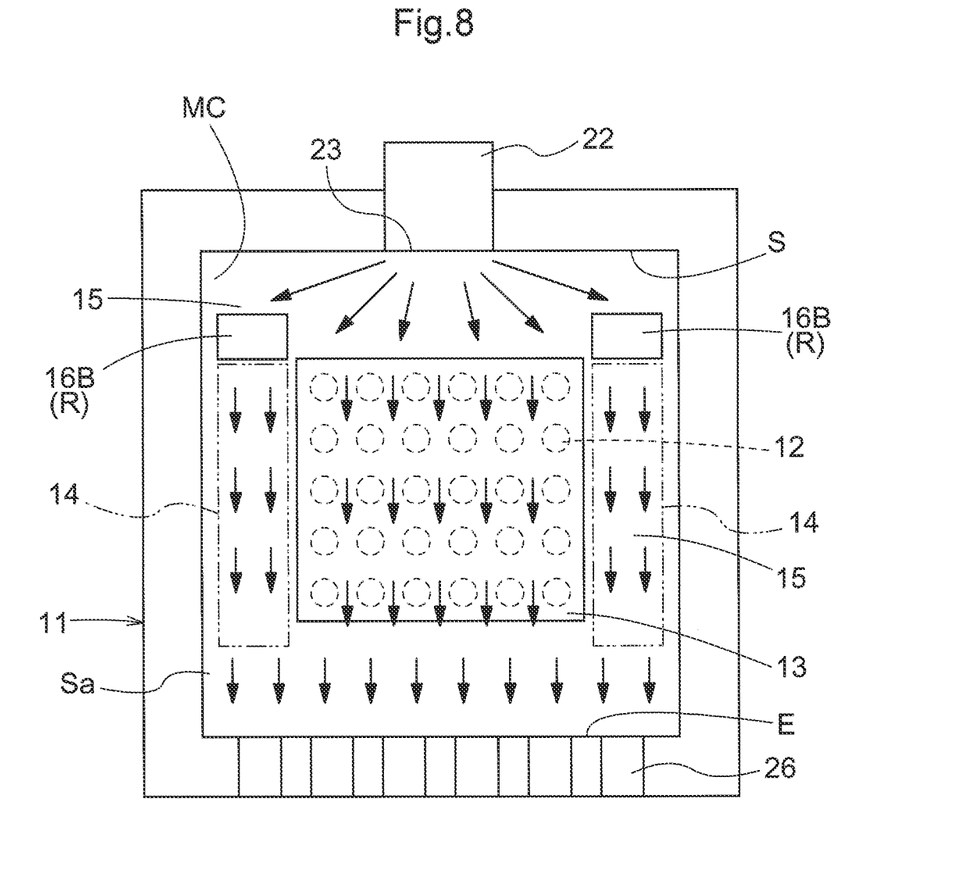
FIG. 8 is a diagram schematically illustrating a mold die for Alternative Embodiment 3 as viewed from above.

3. As illustrated in FIG. 8, the present embodiment involves, an object to be molded, a substrate 11 provided with a chip 13 in the central area and a plurality of individual passive components 14 such as capacitors, coils, and resistors in the entire areas laterally opposite to each other across the chip 13. The flow-path restricting mechanism R, in this case, cannot be disposed in the areas lateral to the chip 13, and is thus in the form of a pair of movable blocks 16B (which is an example of the "restrictor") configured to narrow the lateral flow paths 15 and each positioned in a portion of the corresponding lateral area of the substrate 11 which portion is apart from the chip 13 toward the gate 23. This allows the movable blocks 16B to narrow the flow path for molten resin in the lateral areas of the substrate 11 between the gate 23 and the chip 13, and in turn allows molten resin to flow in the outer area of the cavity MC, in which the chip 13 is not disposed, at a speed nearly equal to the speed at which molten resin flows in the narrow space between the substrate 11 and the chip 13. The movable blocks 16B for the present embodiment are also sized and positioned in view of the speed of the flow of molten resin through the narrow space between the substrate 11 and the chip 13 as well as, for example, the respective flow resistances and footprints of the individual passive components 14.

Figure 9:
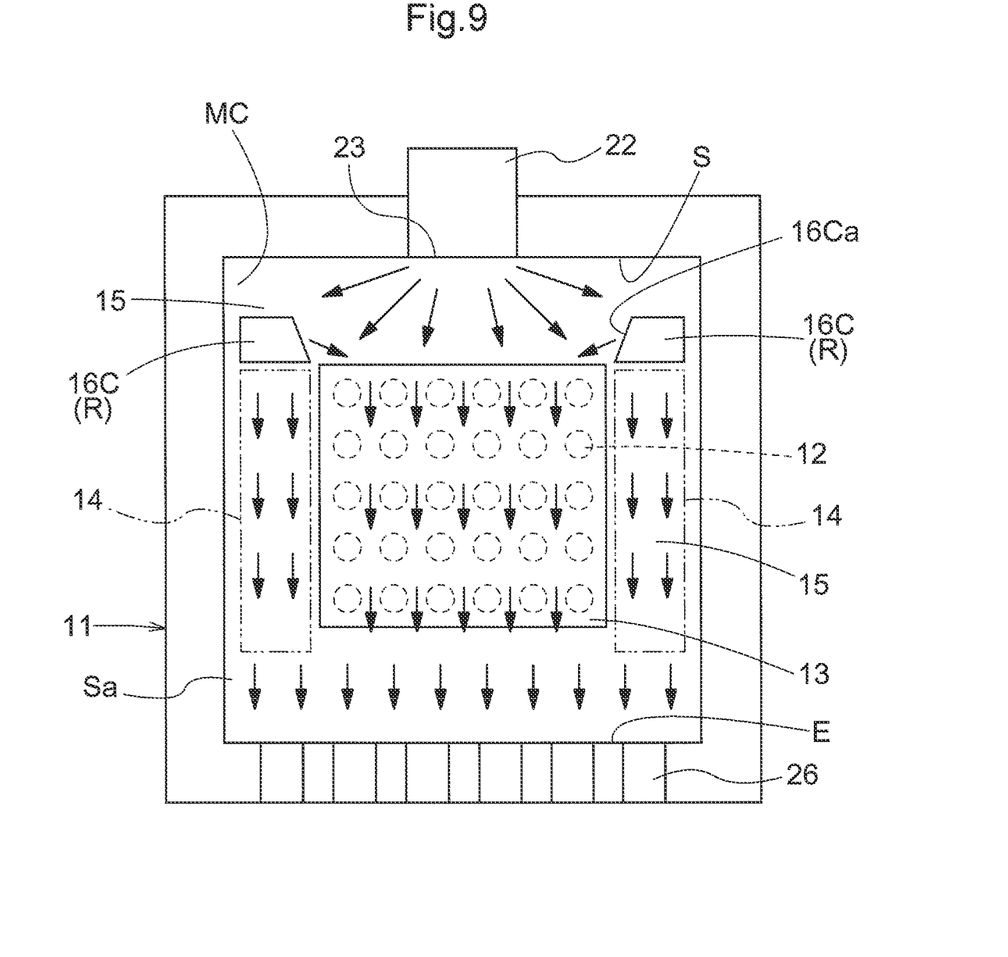
FIG. 9 is a diagram schematically illustrating a mold die for Alternative Embodiment 4 as viewed from above.

4. The present embodiment illustrated in FIG. 9 is similar to the embodiment illustrated in FIG. 8: It involves, an object to be molded, a substrate 11 provided with a chip 13 in the central area and a plurality of individual passive components 14 in the entire areas laterally opposite to each other across the chip 13. The flow-path restricting mechanism R is in the form of a pair of movable blocks 16C (which is an example of the "restrictor") configured to narrow the lateral flow paths 15 and each positioned in a portion of the corresponding lateral area of the substrate 11 which portion is apart from the chip 13 toward the gate 23. The pair of movable blocks 16C for the present embodiment have respective inclined faces 16Ca so inclined that the movable blocks 16C are closer to each other at a position farther away from the gate 23 toward the chip 13. The inclined faces 16Ca serve to guide a portion of molten resin in the lateral areas of the substrate 11 toward the central area of the substrate 11 between the gate 23 and the chip 13, and thereby increase the amount of molten resin flowing through the narrow space between the substrate 11 and the chip 13. This in turn allows molten resin to flow in the outer area of the cavity MC, in which the chip 13 is not disposed, at a speed nearly equal to the speed at which molten resin flows in the narrow space between the substrate 11 and the chip 13. The movable blocks 16C for the present embodiment are also sized and positioned in view of the speed of the flow of molten resin through the narrow space between the substrate 11 and the chip 13 and the respective flow resistances of the individual passive components 14. The movable blocks 16 and 16A for the embodiments described above may alternatively have inclined faces 16Ca.

5. The movable blocks 16, 16A, 16B, and 16C as the flow-path restricting mechanism R may each be configured such that the leading end 16a can come into close contact with a substrate 11 during the molding step. This configuration can also narrow the lateral flow paths 15, as molten resin flows through the clearance between the movable blocks 16 and the cavity MC (which corresponds to the difference between the width W1 of each lateral flow path 15 and the width W2 of the corresponding movable block(s) 16), and thus flows on paths with respective cross-sectional areas reduced as compared to a case involving no movable blocks 16. Further alternatively, the movable blocks 16 as the flow-path restricting mechanism R may each have a leading end 16a with protrusions and depressions. This allows the protrusions and depressions to narrow the lateral flow paths 15 when the movable blocks 16 are in close contact with a substrate 11. With either of the above configurations, the leading end 16a or the protrusions and depressions come into contact with a substrate 11, which eliminates the need to delicately control the movable blocks 16 to leave a gap between the movable blocks 16 and the substrate 11. The flow-path restricting mechanism R may be in the form of not movable blocks 16 but unmovable blocks that are fixed in such a manner as to constantly narrow the lateral flow paths 15. As described above, the flow-path restricting mechanism R may be configured in any manner as long as the flow-path restricting mechanism R is capable of narrowing the lateral flow paths 15 to reduce the amount of molten resin flowing through the lateral flow paths 15.

6. The lower die LM may also have cavities MC so that an object to be molded is sealed up in resin on both faces.

7. The pot 21, the cavity block, and the cull block may each be included in either of the upper die UM and the lower die LM. Further, the cull block may have any number of gates 23 in any arrangement; for example, a gate 23 may extend entirely along the one side S of the corresponding cavity MC.

8. The object to be molded, that is, to be sealed up in resin, is not limited to a flip-chip substrate, and may be a lead frame or a substrate provided with a semiconductor chip. The mold die C and resin molding apparatus D described above may each be used to entirely seal up in resin a substrate with a plurality of semiconductor chips for production of MAP (molded array packaging).

9. The embodiments described above involve molding an object by a transfer method while the object is facing upward. This disclosure may alternatively involve molding an object by a transfer method while the object is facing downward; that is, this disclosure may be arranged such that objects to be molded such as resin-sealing target substrates Sa are fixed to the upper die UM, while the lower die LM has cavities MC.

10. The embodiments described above involve exposing a face of the chip 13. This disclosure may alternatively involve covering that face of the chip 13 with resin. In this case, the flow-path restricting mechanism R may further include a movable block positioned to be over a chip 13 and configured to temporarily stop molten resin from flowing from the gate 23 across the upper face of the chip 13 toward the air vents 26.

Summary of Above Embodiments

The description below summarizes the mold die C, the resin molding apparatus D, and the method for producing a resin molded product each described above as an embodiment.

(1) A mold die C characteristically includes: a mold die body M that is configured to hold a resin-sealing target substrate Sa (object to be molded) including a substrate 11 and a chip 13 mounted in a central area of the substrate 11 and that has a cavity MC which is rectangular in a plan view and which is configured to receive resin tablets T (resin material), the mold die body M including: a pot 21 for the resin tablets T (resin material); a gate 23 disposed at one side S of the cavity MC and configured to allow molten resin (resin material) to flow into the cavity MC; and a flow-path restricting mechanism R that is disposed on both lateral sides of the cavity MC that are perpendicular to the one side S and that is configured to narrow lateral flow paths 15, the lateral flow paths 15 being flow paths for the molten resin (resin material) flowing through the cavity MC in which the chip 13 is not disposed.

The above configuration includes a flow-path restricting mechanism R on both lateral sides of the cavity MC that are perpendicular to the one side S of the cavity MC. The flow-path restricting mechanism R is configured to narrow lateral flow paths 15 for molten resin flowing through the cavity MC. The flow-path restricting mechanism R narrows the lateral flow paths 15 to reduce the amount of molten resin flowing through the lateral flow paths 15. For a substrate 11 having a central area provided with a chip 13, which is a flow resistance for molten resin, the above configuration can reduce the amount of molten resin flowing through an outer area of the cavity MC in which the chip 13 is not disposed. The above configuration thereby allows molten resin to flow in the outer area of the cavity MC, in which the chip 13 is not disposed, at a speed nearly equal to the speed at which molten resin flows in the inner area of the cavity MC, in which the chip 13 is disposed. This allows the leading portions of molten resin in the outer area of the cavity MC to be aligned horizontally with the leading portion of molten resin in the inner area of the cavity MC, and thereby prevents the molten resin in the outer area from going around into the inner area to contain air at the terminal end of the flow (the other side E) of molten resin through the cavity MC. This in turn likely prevents voids in resin-sealed substrates Sb (resin molded product), improving the accuracy in molding.

(2) The mold die C may be arranged such that the flow-path restricting mechanism R is configured to narrow and fully open the lateral flow paths 15.

With the above configuration, the flow-path restricting mechanism R is configured to narrow and fully open the lateral flow paths 15. The flow-path restricting mechanism R is thus capable of first narrowing the lateral flow paths 15 and then fully opening the lateral flow paths 15. This can let gas generated from molten resin escape into the opened space, preventing the gas from remaining in the chip area and causing voids.

(3) The mold die C may be arranged such that the flow-path restricting mechanism R is in a form of movable blocks 16 (restrictors) disposed over the respective lateral flow paths 15 and configured to narrow the lateral flow paths 15 such that a leading end 16a of each movable block 16 (restrictor) is at such a height as to coincide in a side view with a narrow space (gap area) between the substrate 11 and the chip 13 included in the resin-sealing target substrate Sa (object to be molded), which further includes a plurality of protruding electrodes 12 arranged on the substrate 11 in a two-dimensional array and electrically connected to the chip 13. The embodiments described above are each an example in which the protruding electrodes 12 are arranged in a grid pattern. The protruding electrodes 12 are, however, simply arranged in a two-dimensional array, for example, in two lines.

For a flip-chip substrate including a substrate 11, protruding electrodes 12 on the substrate 11, and a chip 13 on the protruding electrodes 12, molten resin flows slowly in a narrow space between the substrate 11 and the chip 13. This would let the molten resin in lateral areas go around into the narrow space, likely causing voids. With the above configuration, the flow-path restricting mechanism R is in the form of movable blocks 16 each arranged such that while it has narrowed the corresponding lateral flow path 15, the leading end 16a is positioned in a side view in the narrow space between the substrate 11 and the chip 13. This reliably reduces the amount of molten resin flowing through the lateral flow paths 15. This in turn allows molten resin to flow in the outer area of the cavity MC, in which the chip 13 is not disposed, at a speed nearly equal to the speed at which molten resin flows in the narrow space. For a flip-chip substrate, the above configuration allows the leading portions of molten resin in the outer area of the cavity MC to be aligned horizontally with the leading portion of molten resin in the inner area of the cavity MC, and thereby prevents the molten resin in the outer area from going around into the inner area to contain air at the terminal end of the flow (the other side E) of molten resin through the cavity MC.

(4) A resin molding apparatus D characteristically includes: a mold die C according to any one of (1) to (3) above; and a mold clamp mechanism 35 configured to clamp the mold die C.

The above configuration includes the above-described mold die C as a mold die to be clamped for an improved accuracy in molding.

(5) A method for producing a resin molded product is characteristically a method for producing a resin-sealed substrate Sb (resin molded product) with use of a resin molding apparatus D according to (4) above, the method including: supplying the mold die C with the resin-sealing target substrate Sa (object to be molded) and the resin tablets T (resin material); clamping the mold die C while heating the resin tablets T (resin material); and causing the molten resin (resin material) to flow through the gate 23 into the cavity MC for resin molding of the resin-sealing target substrate Sa (object to be molded) while causing the flow-path restricting mechanism R to narrow the lateral flow paths 15.

The above method includes causing the flow-path restricting mechanism R to reduce the amount of molten resin flowing through the lateral flow paths 15 during the causing of the molten resin to flow. This allows molten resin to flow in the outer area of the cavity MC, in which the chip 13 is not disposed, at a speed nearly equal to the speed at which molten resin flows in the inner area of the cavity MC, in which the chip 13 is disposed. This allows the leading portions of molten resin in the outer area of the cavity MC to be aligned horizontally with the leading portion of molten resin in the inner area of the cavity MC, and thereby prevents the molten resin in the outer area from laterally entering the inner area to contain air at the terminal end of the flow of molten resin through the cavity MC. This in turn likely prevents voids in resin-sealed substrates Sb (resin molded product), improving the accuracy in molding.

(6) The method may be arranged such that the causing of the molten resin (resin material) to flow further includes deactivating the flow-path restricting mechanism R to open the lateral flow paths 15 after the molten resin (resin material) has substantially entirely covered the central area of the substrate 11.

The arrangements disclosed for the above embodiments (including the alternative embodiments; hereinafter the same applies) may each be combined with an arrangement disclosed for another embodiment, as long as such a combination does not cause a contradiction. Further, the embodiments disclosed in the present specification are mere examples. This disclosure is not limited to those embodiments, and may be altered as appropriate, as long as such an alteration does not result in a failure to attain an object of this disclosure. For instance, the above embodiments (illustrated in, for example, FIGS. 4 and 6) involve sealing up resin-sealing target substrates Sa in resin with the upper face of each chip 13 in contact with the molding surface of the upper die UM to produce resin-sealed substrates Sb each with the chip 13 having an exposed upper face. The embodiments may, however, alternatively be configured to cover the upper face of each chip 13 with resin.

INDUSTRIAL APPLICABILITY

This disclosure is applicable to a mold die, a resin molding apparatus, and a method for producing a resin molded product. This disclosure is applicable particularly effectively to production of a thick package including sealing resin with a thickness of 1 mm or more or a package for use in a vehicle. This disclosure is also applicable particularly effectively to the case of a mold underfill process for a flip-chip substrate including a substrate and a chip with a gap therebetween of approximately 10 μm to 100 μm.

REFERENCE SIGNS LIST

11 Substrate
12 Protruding electrode
13 Chip
15 Lateral flow path
16 Movable block (restrictor)
21 Pot
23 Gate
35 Mold clamp mechanism
C Mold die
D Resin molding apparatus
M Mold die body
MC Cavity
R Flow-path restricting mechanism
S First side
Sa Resin-sealing target substrate (object to be molded)
Sb Resin-sealed substrate (resin molded product)
T Resin tablet (resin material)

The invention claimed is:

1. A mold die, comprising:
a mold die body that is configured to hold an object to be molded, the object including a substrate on which a plurality of protruding electrodes are arranged in a two-dimensional array and a chip mounted in a central area of the substrate and electrically connected to the protruding electrodes, and that has a cavity which is rectangular in a plan view and which is configured to receive a resin material, the cavity including lateral flow paths for the resin material to flow on lateral sides of the chip,
the mold die body including:
a pot for the resin material;
a gate disposed at one side of the cavity and configured to allow the resin material to flow into the cavity; and
a flow-path restricting mechanism that is disposed on both lateral sides of the cavity that are perpendicular to the one side and that is configured to narrow the lateral flow paths to reduce an amount of the resin material flowing through the lateral flow paths,
wherein the flow-path restricting mechanism includes a movable block disposed over the respective lateral flow path and configured to reduce the amount of the resin material flowing through the lateral flow path such that a leading end of each of the movable blocks coincides in a side view with a gap area between the substrate and the chip where the protruding electrodes are present, and
the movable block has a width of from 50% to 90% of a width of the lateral flow path.

2. The mold die according to claim 1, wherein
the flow-path restricting mechanism is configured to narrow and widen the lateral flow paths.

3. A resin molding apparatus, comprising:
a mold die according to claim 1; and
a mold clamp mechanism configured to clamp the mold die.

4. A method for producing a resin molded product with use of a resin molding apparatus according to claim 3, the method comprising:
supplying the mold die with the object to be molded and the resin material;
clamping the mold die while heating the resin material; and
causing the resin material to flow through the gate into the cavity for resin molding of the object to be molded while causing the flow-path restricting mechanism to narrow the lateral flow paths.

5. The method according to claim 4, wherein
the causing of the resin material to flow further includes deactivating the flow-path restricting mechanism to open the lateral flow paths after the resin material has been supplied to the central area of the substrate.

* * * * *